United States Patent [19]

Rich

[11] 3,813,979

[45] June 4, 1974

[54] APPARATUS AND METHOD FOR GAUGING THE SHEAR OF CIRCUIT BOARDS TO SIZE

[75] Inventor: Dennis E. Rich, Phoenix, Ariz.

[73] Assignee: Honeywell Information Systems Inc., Waltham, Mass.

[22] Filed: Apr. 5, 1972

[21] Appl. No.: 241,291

[52] U.S. Cl. ................................ 83/467, 83/925 R

[51] Int. Cl. ............................................. B26d 7/16

[58] Field of Search ............ 83/467, 468, 391, 268, 83/269, 925

[56] References Cited

UNITED STATES PATENTS

| | | | |
|---|---|---|---|
| 863,204 | 8/1907 | McKee | 83/467 |
| 1,033,527 | 7/1912 | Bradshaw | 83/467 |
| 1,463,786 | 8/1923 | Baldwin | 83/467 A |
| 2,072,106 | 3/1937 | Fitzsimmons | 83/467 |
| 2,156,015 | 4/1939 | Greiner | 83/467 A X |
| 2,339,756 | 1/1944 | Aneiros | 83/467 UX |

*Primary Examiner*—Frank T. Yost

*Attorney, Agent, or Firm*—Edward W. Hughes; Henry K. Woodward

[57] ABSTRACT

A spring finger guide locates a printed circuit board in a shearing assembly. The printed circuit board has shear targets embossed on the printed circuit board by the etching process. The printed circuit board is placed between the shear blades of a shearing apparatus with the shear target underneath the shear blade and held against the spring fingers. Actuation of the shear blades causes the board to be sheared to size at the shear targets.

4 Claims, 5 Drawing Figures

APPARATUS AND METHOD FOR GAUGING THE SHEAR OF CIRCUIT BOARDS TO SIZE

BACKGROUND OF THE INVENTION

This invention relates generally to a gauge for shearing apparatus and more particularly to apparatus and method for gauging the shearing of printed circuit boards.

Printed circuit boards are generally formed and etched with the base material comprising the circuit board oversized compared to the actual circuitry etched on the circuit board. The circuit boards are formed oversized for ease of handling the circuit boards during the various processes required to accomplish the final finished product. However, forming the circuit board oversized causes a problem in that the boards have to be later cut to size to fit between guides which support the printed circuit board.

The general rule on high volume printed circuit boards is to produce a die which is placed over the oversized printed circuit board. The die then delineates the outline of the final printed circuit board. The oversized portion can easily be cut off by any of the various means such as a shearing blade or a saw. The dies are very expensive and they require precision drilled holes which locate the printed circuit board in the die. Problems develop in low-volume circuit boards in that the dies are too costly and would require too much storage space to make it worthwhile to build a die for each of the many types of printed circuit boards needed.

In the prior art, the sizing of low-volume circuit boards comprised placing locating holes drilled in the printed circuit boards a precise distance from the sides of the printed circuit board. The circuit board was then positioned in a shearing machine by placing pins in the drilled holes to hold the board in place, thereby positioning the board for the shearing operation. This method is very slow since the pins have to be located into the drilled holes and into the shearing apparatus for each edge of the printed circuit board. Thus, what is needed is a low-cost method and apparatus for positioning printed circuit boards in shearing apparatus without requiring expensive and extensive setup time.

SUMMARY OF THE INVENTION

The problems of the prior art are solved by providing a method and apparatus which allows the precise locating of printed circuit boards in shearing apparatus. The gauge apparatus uses shear targets embossed on the printed circuit boards at the same time that the circuit art work is etched. The shear targets are etched along each edge of the printed circuit board to be sized and locate the edge of the printed circuit board. A gauge finger is slidably located on the shearing apparatus.

The free end of the spring finger is located immediately adjacent the shearing edges of the shearing blades of the shearing apparatus. The finger is located on the shearing apparatus to engage a shear target on the printed circuit board in order to permit the shearing of the printed circuit board at the precise location. The free edge of the finger comes into contact with the embossed or raised portion of the shear target.

Two or more fingers, each preferably made of a spring steel material, are required to engage an equal number of shear targets to permit straight edged shearing of an elongated printed circuit board. Each finger is slidably located to contact a corresponding raised etched shear target.

The method for shearing a printed circuit board to size comprises the steps of forming the shear targets on the printed circuit board, placing gauge or guide fingers immediate to a shearing apparatus, sliding the printed circuit board beneath the fingers, engaging the fingers with the etched shear targets, and actuating the shear assembly to cause the shear blades to contact and cut the printed circuit board to size.

It is, therefore, an object of the present invention to provide a low-cost gauging apparatus for shearing low-volume printed circuit boards to size.

It is another object of the present invention to provide an enhanced method for cutting printed circuit boards to size.

It is yet another object to provide a method and apparatus for shearing circuit boards to size which uses shear targets etched onto the printed circuit board in the same operation that etched the printed circuits onto the board.

It is a further object to provide a method and apparatus for cutting printed circuit boards to size which does not require the use of locating pins.

These and other objects of the present invention will become apparent to those skilled in the art as the description proceeds.

BRIEF DESCRIPTION OF THE DRAWING

Further features and a more specific description of an illustrated embodiment of the invention are presented hereinafter with reference to the accompanying drawing, wherein.

DESCRIPTION OF THE preferred EMBODIMENT

Figure 1:
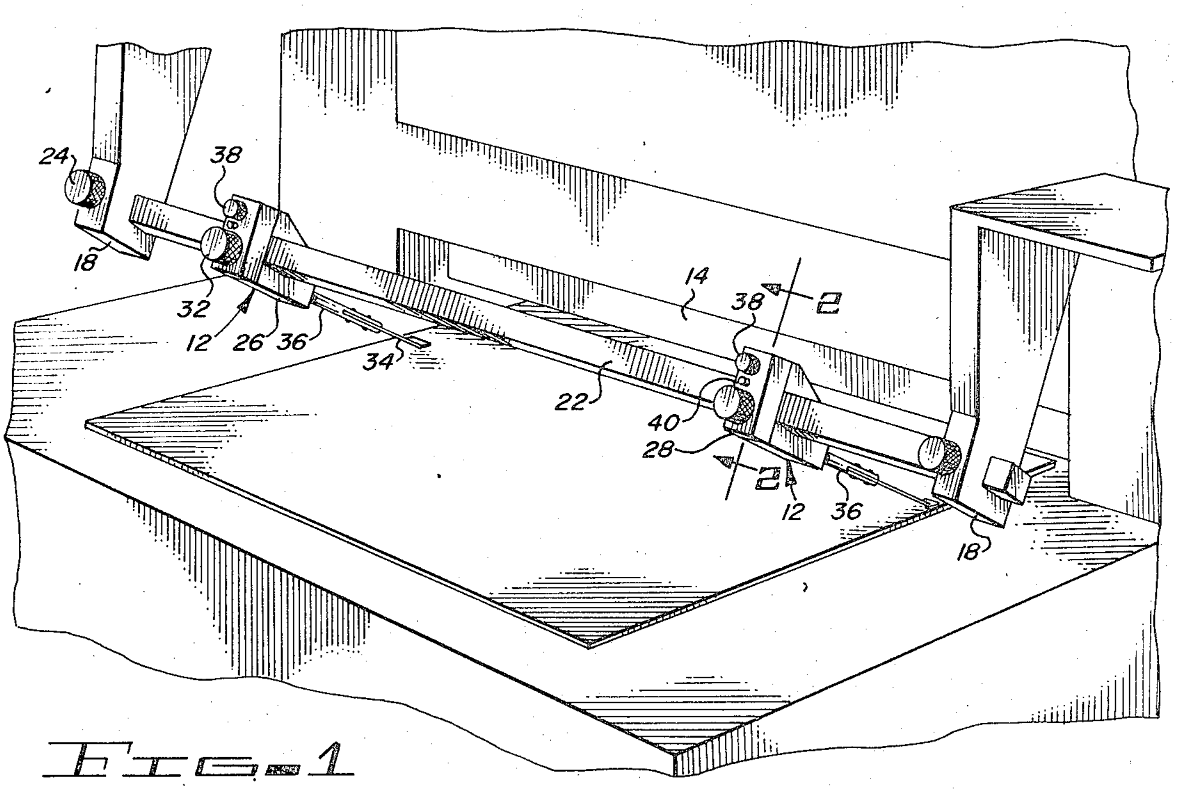
FIG. 1 is an isometric view of the front of a shear fixture with the gauging apparatus positioned for shearing a printed circuit board.

In FIG. 1 a shearing fixture 10 is shown having the gauge apparatus 12 of the present invention attached thereto. Only a portion of the shearing fixture 10 is shown comprising a shear blade 14 and a shear table 16. The shearing fixture 10 is a standard assembly used for cutting a sheet of material such as a printed circuit board or metals such as copper or iron along a straight edge. The shear blade 14 is an elongated bar of hardened metal which contacts the shear table 16 or a lower shear blade (not shown) at a very closely spaced distance to perform the shearing or cutting of the material placed on the shear table underneath the shear blade. Shearing fixtures are well known in the art and a further discussion of the shearing fixture 10 is not needed for a further understanding of the present invention.

Onto the front side of the shearing fixture 10 immediate to the shear blade 14 are located two standards 18 fastened to the shearing fixture 10 at opposite ends of the shear blade 14. A bar 22 for holding the gauge apparatus 12 of the present invention in a rigid position is slidably journaled to the standards 18 at opposite ends of the bar 22. A knurled set screw 24 on each standard 18 holds the bar from sliding within the standards.

Figure 2:
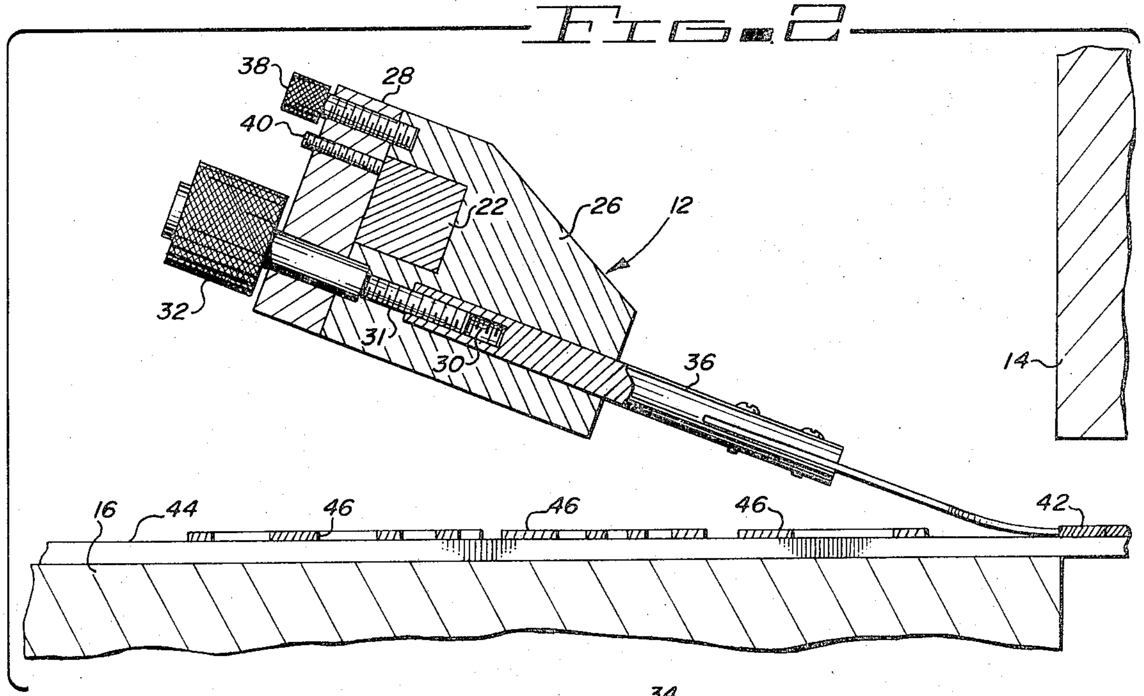
FIG. 2 is a sectional side view taken along lines 2—2 of FIG. 1 and shows the gauges in position contacting the shear targets on a printed circuit board.

Referring to FIGS. 1 and 2, the gauge assemblies 12 are slidably fastened to the bar 22. Each gauge assembly 12 comprises a yoke 26, a cap 28, a second knurled knob 32, a gauge finger 34, and a holder 36 for fastening the gauge finger 34 to the yoke 26. The holder 36 is journaled to the yoke 26 and has a threaded portion 30 in the end of the holder 36 held within the yoke 26. The threaded portion 30 mates with a screw 31 fastened to the knob 32 and journaled through the cap 28. Turning the knob 32 adjusts the length of the gauge finger 34 by turning the screw 31 into and out of the threaded portion 30 of the holder 36. The knob 32 provides a fine adjustment to lengthen or shorten the gauge finger 34 and therefore allows for the repositioning of the gauge finger to adjust for different thicknesses of the printed circuit board or small variations in length of the gauge fingers.

The cap 28 is suitably fastened to the yoke 26 by a screw means 38 to accurately position the yoke 26 onto the bar 22 without excessive play between the yoke and the bar. Each gauge assembly 12 is prevented from sliding along the bar 22 by the screw 40 threaded through the cap 28 and contacting the bar 22. Turning the screw 40 places an end of the screw 40 into contact with the bar 22 and thereby prevents any linear movement of the gauge assembly 12 along the bar 22.

The holder 36 is journaled to the yoke 16 with a free end extending towards the shear blade 14. The holder 36 supports the gauge finger 34. The gauge finger 34 is fastened to the holder 36 by fastening means such as the two screws shown. A better view of the gauge finger is shown in FIGS. 2 and 3.

Referring now to FIG. 2, a sectional view of the gauge assembly 12 comprising the yoke 26, the cap 28, the second knurled knob 32, the holder 36, and the gauge finger 34 are shown. A free end of the gauge finger 34 is shown contacting a shear target 42 on a circuit board 44. The printed circuit board 44 is shown in cross section with a cross-sectional view of etched art work 46 on the printed circuit board. The printed circuit board 44 is shown placed on the shear table 16. The position of the shear blade 14 for contacting the printed circuit board 44 is also shown in FIG. 2. The free end of the gauge finger 34 contacts an embossed or raised portion of the shear target 42 etched on the printed circuit board 44 and thereby positions the circuit board for the shear blade 14 to lower and shear the printed circuit board at the shear target. A closer view of the holder 36 and the gauge finger 34 of the sliding gauge assembly 12 is shown in FIG. 3.

Figure 3:
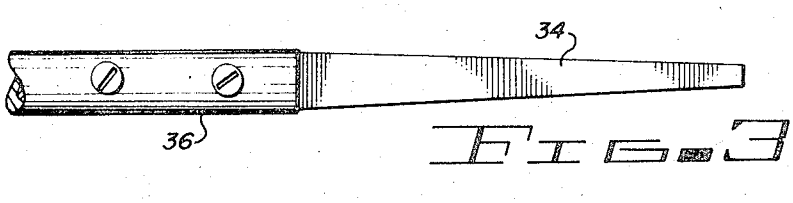
FIG. 3 is a close-up top view of one of the gauge fingers.
Figure 4:
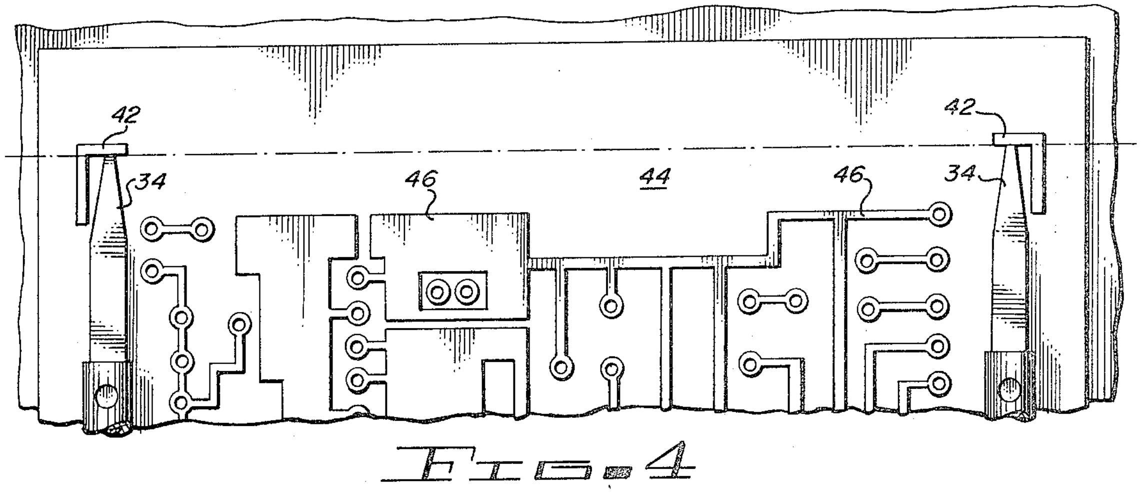
FIG. 4 is a top view of the gauge fingers contacting the shear targets.

Referring now to FIGS. 2 and 3, the finger 34 of the gauge assembly 12 is preferably made of a spring steel which can be pressed against the circuit board 44 as shown in FIG. 2 without damaging the circuit board. The spring steel will form along the printed circuit board 44 and permit a close association with the shear target 42 etched on the printed circuit board. As shown in FIG. 2 the spring finger 34 extends immediately adjacent the shear blade 14. Thus, under the embodiment shown, the entire shear target 42 is cut off the printed circuit board by the shear blade and the end of the gauge finger 34 gauges the cut-off point of the printed circuit board. The gauge finger 34 is preferably squared at the free end to allow a firm locating point with the linearly formed shear target 42. FIG. 4 shows a top view of the gauge fingers 34 contacting the shear targets 42.

Referring now to FIG. 4, the gauge fingers 34 are shown contacting the shear targets 42. The shear targets 42 are preferably rectangular in shape for ease of positioning the gauge fingers 34 against the shear targets 42. In the embodiment shown, the shear line is immediately along the contact point between the shear targets 42 and the gauge fingers 34. The placement of the shear targets 42 in this position permits an immediate location of the finished circuit board size. It is, of course, obvious that the shear target 42 could be placed on the gauge finger side of the shear line with the outer edge of the shear target delineating the size of the circuit board. The size and placement of the target in the preferred embodiment should not be taken as limiting this invention.

The circuit board 44 is held firmly against the gauge fingers 34 during a shearing operation to accurately position the cut-off point of the circuit board. The gauge assemblies 12 are slidably positioned on the bar 22 (see FIG. 1) so that different sized boards could be sized by this invention. The shear targets on smaller boards would be positioned closer together and thus the gauge assemblies would have to be positioned closer together. The gauge assemblies are set up by an operator before each different circuit board is sized. The gauge assemblies are placed a distance apart according to the distance between the shear targets. Therefore, when the art work for a printed circuit board is prepared, the shear targets must be precisely placed to locate the edges of the finished product. At this time, the best spacing between the shear targets can be determined according to the size of the circuit board.

Further, according to the preferred embodiment, the shear line according to FIGS. 2 and 4, is at the contact point between the shear target 42 and the gauge finger 34. The placement of the shear line at this point permits the easy removal of the printed circuit board after shearing. The printed circuit board will not have to be moved such that the shear targets 42 are out of contact with the gauge fingers 34 if the entire shear target is removed in the shearing process. However, other placements of the shear targets are contemplated by this invention other than the placement according to the preferred embodiment, which appears to be the best mode of operation.

The operation of the gauge apparatus according to the present invention can best be shown by describing an operation of the shearing of a printed circuit board to size. Referring now to FIGS. 1, 2, 3 and 4, the sliding gauge assembly 12 is positioned to contact the printed circuit board 44 at the shear target 42 etched on the printed circuit board 44. Preferably two or more gauge assemblies 12 are located on a shearing fixture 10 to permit linear positioning of the printed circuit board 44 in relation to the shear blade 14. It is obvious that more than two gauge assemblies 12 could be positioned on the bar 22 adjacent to the shear assembly if necessary for long printed circuit boards. It is also obvious that only one gauge assembly need be used if perhaps an edge of the printed circuit board perpendicular to the shear blade could be accurately located against an edge of the shear table. Thus the number of gauge assemblies should not be taken to limit the scope of the present invention.

For the preferred embodiment, the two gauge assemblies 12 are located in the area of the shear targets 42 on the printed circuit board 44 by sliding the gauge assemblies 12 along the bar. When correctly located above the shear targets 42, the locking screws 40 on both assemblies are turned to lock each guage assembly 12 into position. The printed circuit board 44 is then placed on the shear table 16 and slid under the gauge finger 34 of both gauge assemblies 12. The printed circuit board 44 is positioned toward the shear blade 14 under the gauge finger 34 of both gauge assemblies 12 until the shear targets 42 are beyond the end of the gauge fingers. The printed circuit board 44 is then positioned back away from the shear blade 14 until the end of the gauge fingers 34 contact the shear targets 42. The shear targets 42 are raised portions on the printed circuit board and thus the gauge fingers 34 will contact the shear target and prevent further forward motion of the circuit board. The circuit board 44 is held into position with the shear targets 42 firmly against the ends of the gauge fingers 34 and the shear fixture is actuated to cause the shear blade 14 to lower and cut off the printed circuit board at the shear targets.

Figure 5:
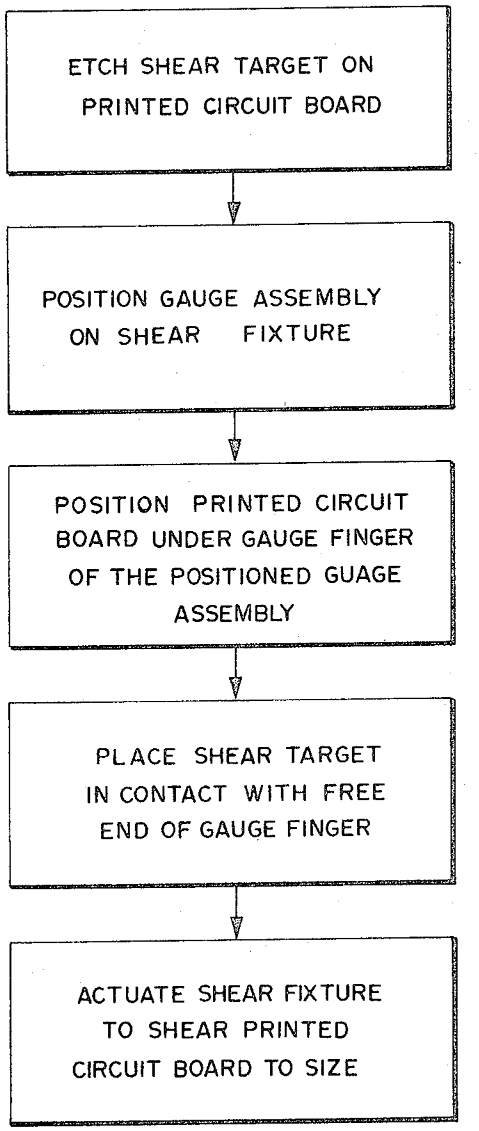
FIG. 5 is a flow diagram of the steps used to practice the process according to the disclosed invention.

Thus having explained the gauging apparatus according to the present invention, the method for cutting a printed circuit board to size will next be explained. Referring now to FIG. 5, steps for shearing a printed circuit board to size are given. In the first step, shear targets are etched in the printed circuit board locating a desired edge of the printed circuit board. The next step is positioning a gauge assembly comprising a gauge or locating finger immediately adjacent to a shear blade. The third step is to position the printed circuit board having the etched shear targets located thereon under the gauge fingers of the located gauge assembly. The fourth step is to place the shear targets in contact with the free ends of the fingers of the gauge assembly. The last step is to actuate the shear assembly to cause the shear blade to cut the printed circuit board to size. One edge of the printed circuit board is thus cut to the correct size. The correct size is determined by the shear targets etched on the circuit board at the same time that the runs and pads comprising the electronic connections of the circuit on the printed circuit board are etched.

The principles of the invention have now been made clear in an illustrative embodiment. There will be immediately obvious to those skilled in the art many modifications of structure, arrangement, proportions, the elements, materials, and components used in the practice of the invention. For instance spring steel is included as a type of material which could comprise the gauge finger of the gauge assembly. While spring steel is perhaps the best material for use as the finger, it is obvious that plastic or other metals could be used without departing from within the scope of the invention. Also the preferred embodiment discloses the use of the copper plating etched or embossed to form the shear target on the printed circuit board. It is further obvious that the material forming the printed circuit board could be embossed to form the shear target. The appended claims are therefore intended to cover and embrace any such modifications, within the limits only of the true spirit and scope of the invention.

I claim:

1. Apparatus for gauging the shearing of a printed circuit board to size on a shear fixture comprising:

a shear target embossed on the printed circuit board;

a pair of standards mounted to the shear fixture perpendicular to and on opposing ends of a shear blade of the shear fixture;

a bar slidably fastened to each of said pair of standards and mounted parallel to the shear blades; and at least one gauge assembly slidably mounted to said bar, said gauge assembly including a gauge finger having one end fastened to said gauge assembly and a free end disposed perpendicular to and adjacent the shear blade;

wherein the shear blade shears the printed circuit board to size according to the location of said shear targets.

2. A gauging apparatus according to claim 1 wherein said finger is formed from spring steel.

3. A gauging apparatus according to claim 1 wherein the contact point of the finger and the shear target defines the shear line for cutting the printed circuit board.

4. A gauging apparatus according to claim 1 wherein the shear target is formed from the same material used for the electrical circuitry on the printed circuit board.

* * * * *